United States Patent [19]
Aine et al.

[11] Patent Number: 4,600,934
[45] Date of Patent: Jul. 15, 1986

[54] METHOD OF UNDERCUT ANISOTROPIC ETCHING OF SEMICONDUCTOR MATERIAL

[75] Inventors: Harry E. Aine, 30600 Page Mill Rd.; Barry Block, 30610 Page Mill Rd., both of Los Altos, Calif. 94022

[73] Assignees: Harry E. Aine; Barry Block, both of Palo Alto, Calif.

[21] Appl. No.: 573,693

[22] Filed: Jan. 25, 1984

Related U.S. Application Data

[63] Continuation-in-part of Ser. No. 568,740, Jan. 6, 1984, abandoned.

[51] Int. Cl.⁴ ............... H01L 29/84; H01L 21/308; H01L 21/306; G01L 1/22
[52] U.S. Cl. ........................................ 357/26; 357/55; 156/651; 156/653; 156/657; 156/659.1; 156/662; 29/580; 29/610 SG; 73/517 R; 338/2; 338/4; 338/42; 338/47
[58] Field of Search ............... 156/628, 345, 647, 648, 156/649, 655, 650, 651, 653, 654, 657, 659.1, 662; 148/1.5; 29/580, 584, 586, 610 SG, 595, 594; 338/2, 4, 42, 47; 73/510, 517 R, 726, 754; 357/26, 55

[56] References Cited

U.S. PATENT DOCUMENTS 4,144,516 3/1979 Aine ............................ 29/580 X
4,293,373 10/1981 Greenwood ................... 156/647 X
4,342,227 8/1982 Petersen et al. .................... 73/510
4,472,239 9/1984 Johnson et al. ..................... 156/647

OTHER PUBLICATIONS

Petersen, K. E., "Dynamic Micromechanics on Silicon: Techniques and Devices," IEEE Transactions on Electronic Devices, vol. ED-25, No. 10, Oct. 1978, pp. 1241-1250.

Kendall, Don L., "On Etching Very Narrow Grooves in Silicon", Applied Physics Letters, vol. 26, No. 4, Feb. 15, 1975, pp. 195-198.

Bassous, Ernest, "Fabrication of Novel Three-Dimensional Microstructures by the Anisotropic Etching of (100) and (110) Silicon", IEEE Transactions on Electronic Devices, vol. ED-25, No. 10, Oct. 1978, pp. 1178-1185.

Bean, Kenneth E., "Anisotropic Etching of Silicon", IEEE Transactions on Electronic Devices, vol. ED-25, No. 10, Oct. 1978, pp. 1185-1193.

Primary Examiner—Edward Kimlin
Assistant Examiner—Ramon R. Hoch
Attorney, Agent, or Firm—Harry E. Aine

[57] ABSTRACT

An etch stopped layer portion overlying a (100) or (110) major face of a diamond cubic semiconductor material is undercut anisotropically etched by orienting a side edge of the etch stopped layer portion which is to be undercut, at an angle to the most nearly parallel {111} trace on the (100) or (110) face. The etch time is further reduced by slotting through the etch stopped layer with slots oriented at an angle to the {111} traces on the underlying (100) or (110) face. Undercut bridge structures are formed by undercutting quadrilateral etch stopped layer portions from opposite sides of the quadrilateral or from the sides plus slots forming diagonals of {111} trace quadrilaterals having combined areas coextensive with the area to be undercut.

12 Claims, 13 Drawing Figures

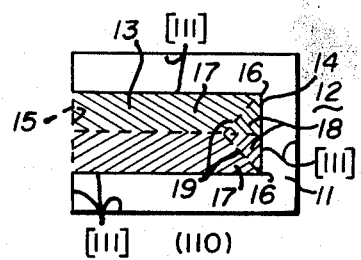
Fig_1
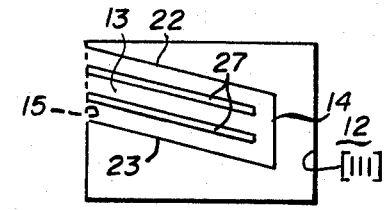
Fig_3
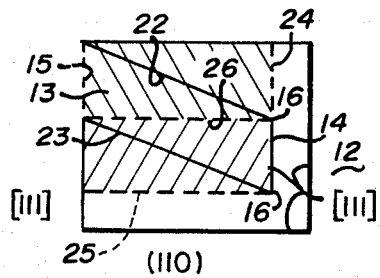
Fig_2
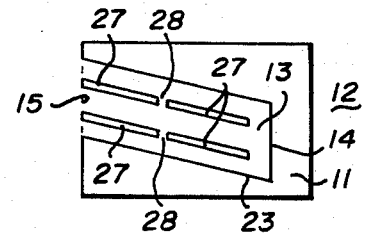
Fig_4
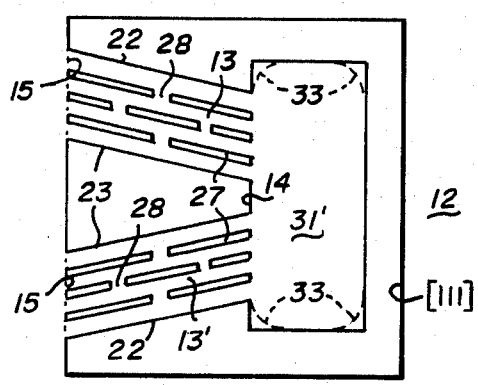
Fig_6
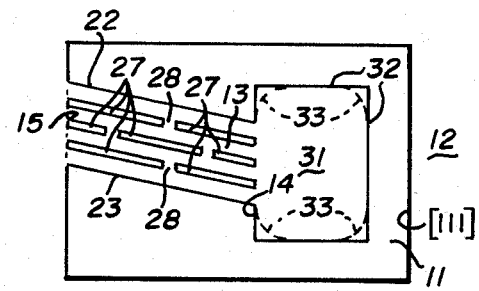
Fig_5
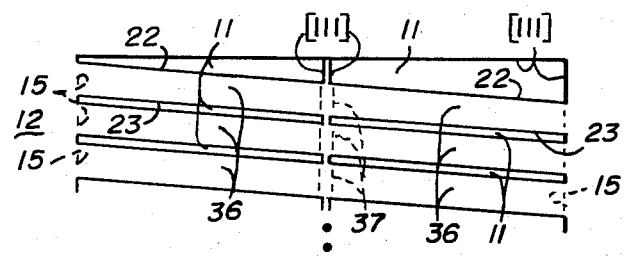
Fig_7

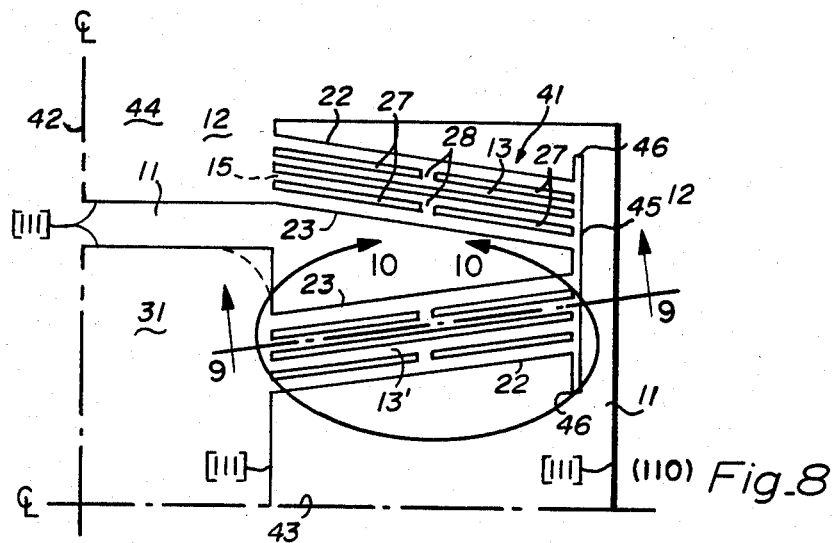
Fig_8
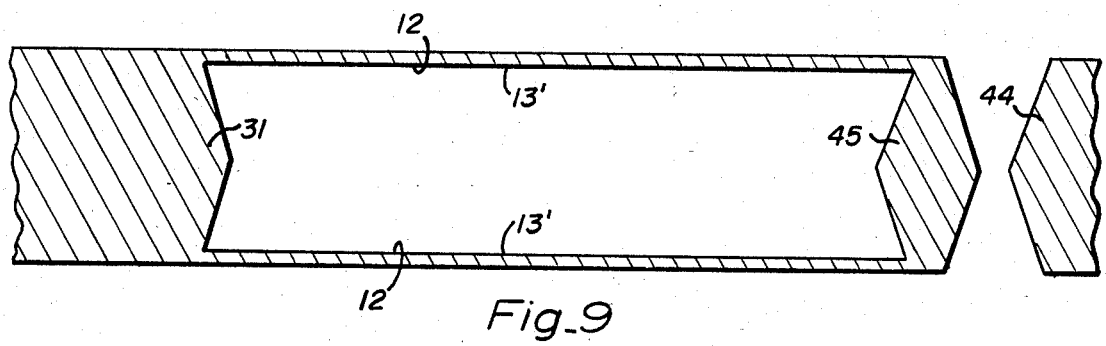
Fig_9
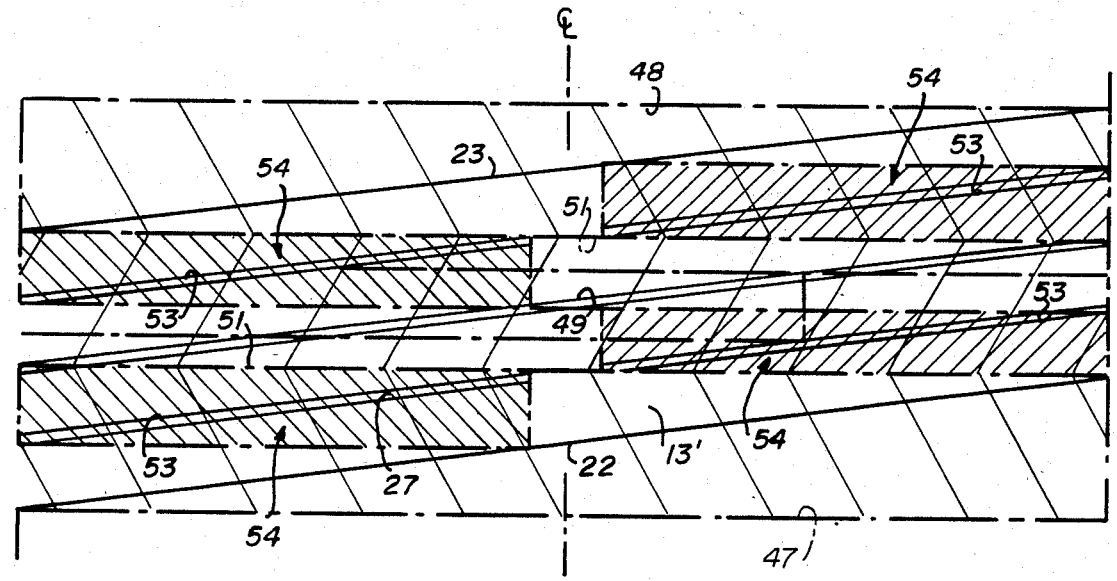
Fig_10

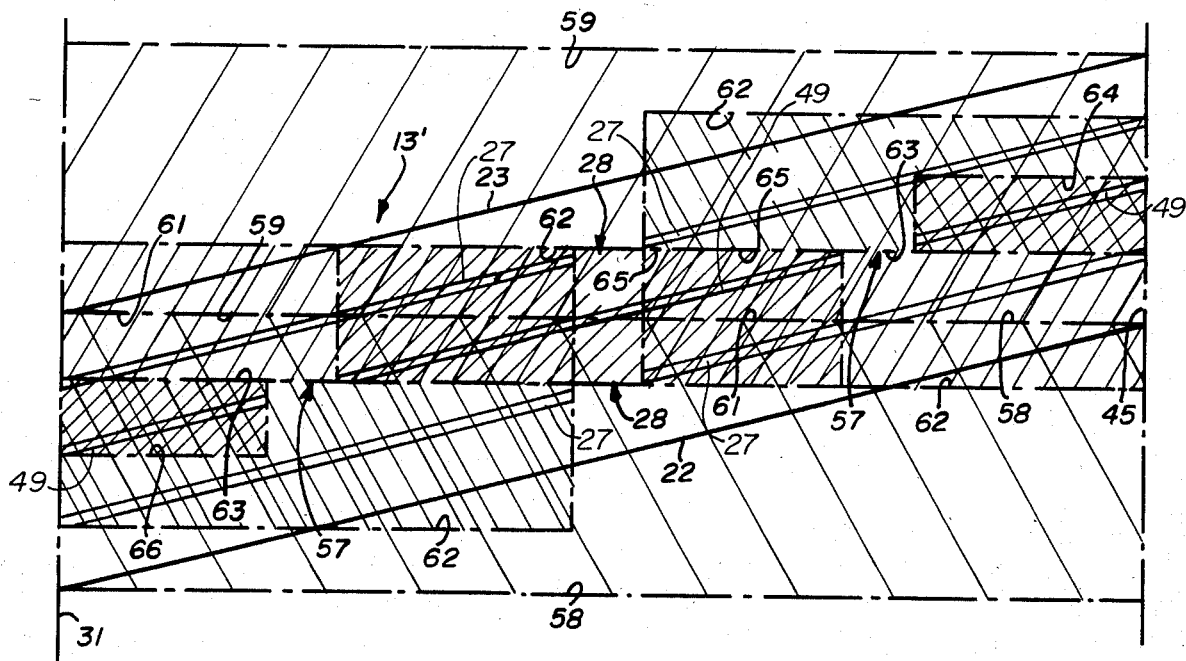
Fig_11
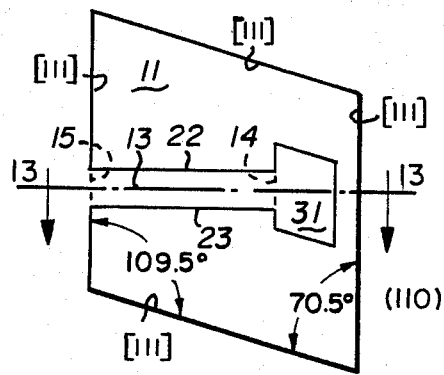
Fig_12
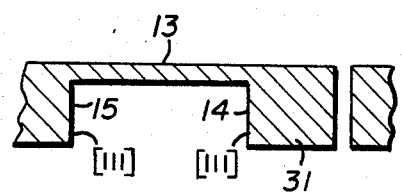
Fig_13

METHOD OF UNDERCUT ANISOTROPIC ETCHING OF SEMICONDUCTOR MATERIAL

The present invention is a continuation-in-part of U.S. patent application Ser. No. 568,740 filed Jan. 6, 1984, now abandoned.

BACKGROUND OF THE INVENTION

The present invention relates in general to undercut anisotropic etching of semiconductive material and, more particularly, to such etching through a face of diamond cubic material, such as silicon.

DESCRIPTION OF THE PRIOR ART

Heretofore, it has been proposed to make symmetrical accelerometer flex structures by chemically etching each of a pair of silicon wafers from one of the major faces to define in each wafer a membrane with an integral centrally located silicon mass. The membrane in each wafer was then etched through in a predetermined slot pattern to define folded cantilever beams in the slotted membrane portion for supporting the mass from a surrounding frame structure. The pair of etched wafers were then bonded together in back-to-back relation with the masses in registration to form symmetrical accelerometer flex structures. Devices of this type are disclosed in U.S. Pat. No. 4,144,516 issued Mar. 13, 1979.

While the aforementioned techniques may be employed for fabrication of symmetrical accelerometer flex structures, there are certain problems associated therewith that it would be desirable to eliminate. One of the problems is that the composite symmetrical flex structure is fabricated by bonding together two wafers. This introduces substantial handling and processing of the relatively fragile etched wafers tending to reduce the yield of acceptable devices. In addition, the bonding material typically has a temperature coefficient substantially different than that of the sillicon flex structure such that undesired temperature coefficients are introduced into the composite structure. Moreover, in the case of a capacitive sensor for sensing deflection of the flex, with capacitive gap spacings on the order of microns, variations in the thickness of the bonding layer result in variations in the overall thickness of the flex structure and thus produces unwanted variations in the capacitance of the capacitor gap of the capacitive sensor.

It is also known from the prior art to form a single cantilever beam by chemically undercutting an etch stopped layer which is to form the cantilever. In some cases, silicon dioxide cantilever beams have been loaded at their ends with a gold mass for increased sensitivity. Devices of this type are disclosed in articles entitled "Silicon as a Mechanical Material", appearing in the proceedings of the IEEE, Vol. 70, No. 5, of May 1982 at pgs. 446–450; and IEEE "Transactions on Electron Devices, Vol. ED-25, No. 10, October 1978 at pgs. 1241–1250.

Some of the problems associated with accelerometers of the latter type are that the single cantilever beams do not exhibit a linear deflection in response to acceleration and, moreover, the mass loading to increase their sensitivity is of a dissimilar metal, typically gold, thereby introducing undesired temperature coefficients and resulting in an unsymmetrical structure which is subject to undesired cross-axis coupling coefficients.

In these prior art systems, where a single cantilever spring member is formed by undercutting an etch stopped layer, the cantilever was elongated and the side edges of the cantilever were arranged to be parallel to the intersection (traces) of the {111} facets with the major face of the wafer which was of (100) orientation. As a result, the undercutting etch began at the corners of the free end portion of the cantilever and progressed along etch fronts inclined at an angle of roughly 20 degrees to the longitudinal axis of the cantilever. In other words, to undercut the cantilever, the etch had to commence at the free end of the cantilever and then progress down the length of the cantilever to its root. For long cantilevers, this is a relatively long etch. The problem with long etches is that it puts severe demands upon the etch stop characteristic of the etch stopped layer. If the etch stop ratio is on the order of 100 to 1, that is, the etch rate on the etch stop layer is 1 when the etch rate on the substrate material which is to be removed, is 100, substantial etching of the etch stop layer can occur during the time it takes for the etchant to undercut the entire cantilever. This results in cantilevers which are not of uniform thickness, i.e., they tend to be thinner at the free end and along the side edges as opposed to the thickness in the center of the cantilever.

Another problem with the prior art method for undercut etching of cantilevers is that the mass could not be formed as an integral part of the cantilever by leaving a non-undercut portion of the wafer to serve as the mass because the undercutting etch proceeded from the free end of the cantilever. Therefore, if a non-undercut portion was to form the mass at the free end of the cantilever, the etch could not be performed.

Therefore, it would be desirable if an undercutting method could be devised which proceeded faster to reduce nonuniformities in the thickness of the undercut member. Moreover, it would be desirable to provide a method for etching which allowed a non-undercut portion to remain at the end of the cantilever member. It would also be desirable in some applications to be able to undercut bridge-like structures extending between non-undercut portions of the wafer.

SUMMARY OF THE PRESENT INVENTION

The principal object of the present invention is the provision of an improved method of undercut anisotropic etching of semiconductive material.

In one feature of the present invention, a side edge of an etch stopped layer portion which is to be under cut is diposed at an angle to the most nearly parallel one of the {111} traces on the face which is being etched such that said oriented side edge will be undercut from the side, whereby the undercut etching time can be reduced in use.

In another feature of the present invention, the etch stopped layer portion which is to be undercut is of a generally quadrilateral geometry having a pair of generally parallel sides essentially parallel to the most nearly parallel one of the {111} traces on the face which is being etched so that after completing the undercut etch said pair of side edges will be bounded by remaining {111} faces.

In another feature of the present invention, the etch stopped layer portion, which is to be undercut, is slotted through to the underlying non-etch stopped face which is to be etched such that undercut etching can proceed through the slots in the structure to be undercut.

In another feature of the present invention, slots which are employed to increase the rate of undercut etching, are elongated with their longitudinal axis disposed at an angle to the most nearly parallel one of the {111} traces on the face which is being etched.

In another feature of the present invention, the etch stopped layer portion which is to be undercut forms a bridge bridging between non-undercut portions of the semiconductor material.

In another feature of the present invention, the side edges, including the side edges of slots, if any, passing through the structure which is to be undercut, define diagonals of rectangles or rhomboids formed by traces of the {111} planes on the face which is being etched, such rectangles or rhomboids having areas essentially completely co-extensive with the area of the etch stopped layer which is to be undercut.

Other features and advantages of the present invention will become apparent upon a perusal of the following specification taken in connection with the accompanying drawings wherein:

BRIEF DESCRIPTION OF THE DRAWINGS

FIG. 1 is a schematic line diagram of an undercut cantilever of the prior art cross-hatched to show the way in which the undercutting etch progresses, FIG. 2 is a schematic line diagram of an undercut cantilever incorporating features of the present invention, FIG. 3 is a view similar to that of FIG. 2 depicting the use of slots for increasing the rate of the undercut etch, FIG. 4 is a view similar to that of FIG. 3 depicting an alternative slot arrangement, FIG. 5 is a schematic line diagram of an undercut cantilever spring with integral non-undercut mass structure affixed at the free end of the cantilever, FIG. 6 is a view similar to that of FIG. 5 depicting an alternative embodiment to the structure of FIG. 5, FIG. 7 is a schematic line diagram depicting undercut bridge structures incorporating features of the present invention, FIG. 8 is a schematic line diagram of a folded cantilever structure incorporating features of the present invention, FIG. 9 is an enlarged sectional view of a portion of the structure of FIG. 8 taken along 9—9 in the direction of the arrows, FIG. 10 is an enlarged view of a portion of the structure of FIG. 8 delineated by line 10—10 and cross-hatched to depict undercut etching characteristics, FIG. 11 is a view similar to that of FIG. 10 depicting an alternative embodiment of the present invention, FIG. 12 is a view similar to that of FIG. 5 depicting etching through the (110) major face of a wafer, and FIG. 13 is a sectional view of the structure of FIG. 12 taken along line 13—13 in the direction of the arrows.

DESCRIPTION OF THE PREFERRED EMBODIMENTS

Referring now to FIG. 1, there is shown a simple cantilever beam etched in accordance with the teachings of the prior art. More particularly, the (100) major face of a semiconductive wafer of diamond cubic type, such as silicon, gallium arsenide, germanium, and indium arsenide has a generally u-shaped opening 11 formed in an etch stopped layer 12 on the major face of the wafer. The etch stopped layer 12 includes a reentrant portion 13 which is to be undercut by the etchant to form a cantilever beam free at end 14 and supported from a non-undercut portion of the wafer at its other or root end 15. The side edges of the u-shaped opening 11 are arranged parallel to the traces of the {111} facets of the material so that substantially no undercutting of the etch stopped layer 12 will occur except for that which commences at external corners 16.

During the etch, the anisotropic etchant is contacted with the non-etch stopped semiconductor material through the opening 11.

In the case of silicon, suitable anisotropic etchants include ethylene diamine pyrocatechol (EDP), and hydroxides of sodium, potassium, lithium and rubidium. The etches are typically carried out at elevated temperatures as of 85 degrees C. The etchant begins undercutting from the corners 16 and progresses along the two incline etch fronts 17 and 18 intersecting along dashed lines 19. The etch continues to recede under the cantilever structure until the etch fronts 18 meet. Then, the etch recedes along fronts 17 which meet in the center of the beam 13 along the longitudinal axis of the cantilever. When the etch fronts 17 intersect with the (111) face at the root portion 15, they terminate on that (111) face and the etch proceeds until the cantilever structure 13 is completely undercut with the undercut etch stopped on the (111) plane at the root 15 of the cantilever 13.

A problem associated with this prior method for undercut etching of structures is that a relatively long time is required to undercut the cantilever 13 because the etch must proceed along the fronts 17 for essentially the full length of the cantilever 13. The result is that to the extent that the etch stop is not perfect, the cantilever experiences more etching at the free end 14 than at the root end 15. Moreover, the cantilever tends to be thicker in the middle than along the two side edges.

The etch stopped layer 12 and the etch stop mechanism can take any one of a number of different forms. For example, the etch stop layer 12 may comprise an oxide of the semiconductive material such as, for example, silicon dioxide. The silicon dioxide layer can be thermally grown or chemically vapor deposited. In another embodiment, the etch stopped layer may comprise a layer of the substrate material which is either more heavily or lightly doped than that portion of the wafer which is to be etched to define an impurity concentration type etch stop. In another embodiment, the etch stopped layer 12 comprises an opposite type conductivity layer to that of the underlying semiconductor material. In this manner a PN junction is formed and the etch stopped layer is passivated by applying a passivating potential to the etch stopped layer in a manner as described in U.S. Pat. No. 3,689,389 issued Sept. 5, 1972, the disclosure of which is hereby incorporated by reference in its entirety.

Referring now to FIG. 2, there is shown an undercut cantilever beam 13 incorporating features of the present invention. The method and apparatus depicted in FIG. 2 is substantially identical to that of the prior art of FIG. 1 with the exception that the cantilever 13 instead of being rectangular is of a rhomboid configuration having two pairs of parallel sides. The sides comprising the end 14 and the root 15 are arranged to be parallel to the {111} traces on the (100) plane, whereas the other two parallel sides 22 and 23 are inclined at an angle to the most nearly parallel trace of the {111} planes with the (100) face. More particularly, the side edges 22 and 23 are oriented to define diagonals of rectangles bounded by the traces of the {111} faces on the (100) face and indicated by the two different kinds of cross-hatching, one for each of the rectangles 24 and 25.

When the side edges 22 and 23 are oriented relative to the {111} traces and the rhomboid dimensioned such that the rectangles 25 and 24 have touching edges at 26, the condition occurs that the cantilever 13 will be undercut without any etching from the corners 16, that is, the undercut etching is independent of the external corners and, in fact, the cantilever 13 would be undercut if no etching occurred from end 14. This condition then allows nonundercut portions to be placed at the end of the cantilever 14 so as to provide a method for undercutting bridge structures bridging between non-undercut portions of the wafer. This condition is satisfied when the rectangles 24 and 25 have touching or overlapping adjoining side edges at 26. Thus, in the embodiment of FIG. 2, the cantilever 13 is undercut etched from both sides 22 and 23, thereby greatly reducing the time to perform the undercut etch of a cantilever 13 of a given length as contrasted with the prior art method for etching rectangular cantilevers wherein the undercutting progressed from the free end 14 back toward the root 15.

Referring now to FIG. 3, there is shown an embodiment similar to that of FIG. 2 with the exception that the etch stopped layer 112, which is to be undercut to form the cantilever 13, has been longitudinally slotted at 27 to provide a pair of slots partitioning the cantilever 13 into three generally parallel leg portions. The slots 27 allow the etchant to undercut the etch stop layer under each side edge of the respective slot 27, in other words, the side edges of the slots 27 act similarly to side edges 22 and 23 of the cantilever 13 of FIG. 2 defining diagonals of respective rectangles. The slots 27 greatly reduce the time to etch the cantilever 13 of a given width and orientation relative to the {111} traces.

Referring now to FIG. 4, there is shown an alternative embodiment similar to that of FIG. 3 wherein each of the longitudinal slots 27 is broken into pairs (interrupted) to allow a bridging portion of the cantilever to interconnect the three parallel leg portions of the cantilever at 28.

Referring now to FIG. 5, there is shown an alternative embodiment of the present invention. This embodiment is similar to that of FIG. 4 with the exception that the opening 11 in the etch stopped layer 12 is patterned to leave a rectangular structure 31 at the end of the cantilever structure 13. The rectangular structure 31 has its side edges 32 aligned parallel to the IItraces on the (100) plane. In addition, additional slots 27 are provided in the cantilever portion 13. The slots are arranged so that the undercut etch time for undercutting the cantilever portion 13 is substantially reduced as compared to the time it would have taken to undercut the cantilever without the slots 27.

The etch is terminated when the cantilever portion 13 has been undercut etched. At this time, there will be some rounding of the external corners of the substrate 31 as indicated by dotted lines 33. If the wafer is etched entirely through its thickness, the enlarged rectangular structure 31 will serve as a sensing mass coupled to the end of the thin cantilever beam portion 13 which is supported at its root 15 from the unetched or frame portion of the die. If desired, the rounding of the edges at 33 can be reduced by the use of corner compensation in the manner taught in U.S. Pat. No. 3,765,969 issued Oct. 16, 1973, the disclosure of which is hereby incorporated by reference in its entirety.

Referring now to FIG. 6, there is shown an alternative embodiment of the present invention. The embodiment of FIG. 6 is essentially the same as that of FIG. 5 with the exception that the rectangular mass structure 31 is elongated and is supported by a second cantilever spring portion 13'. This provides a more symmetrical cantilever support for the mass 31.

Referring now to FIG. 7, there is shown an alternative embodiment of the present invention. In the embodiment of FIG. 7, the undercut structures are similar to those previously described in FIGS. 2–6, with the exception that the openings 11 in the etch stopped layer 12 are arranged so that bridge structures 36, which are to be undercut, extend between wafer regions which are not to be undercut. The structures which are not to be undercut are bounded by (111) faces. As in the embodiment of FIG. 2, the individual bridge structures 36 are oriented, dimensioned and arranged so that the side edges 22 and 23 of each bridge structure define diagonals of rectangles 24 and 25 having touching or overlapping common edges 26. When this condition is met, the bridges 36 will each be fully undercut in the region between the supports from the non-undercut portions of the material at 15 at one end and 37 at the other end.

The undercut bridge structures 36 of FIG. 7 are particularly useful for supporting electrical heating elements when it is desired to reduce the thermal mass of the heating element for fast response and low power. In the case of the heating element, the etch stopped material, forming the bridge 36, may be of the electrical heating material, such as nickel, with the nickel film being supported at opposite ends of each bridge portion 36, and being self-supporting in between. As an alternative, the bridge structure 36 may comprise a thermally insulative material, such as a thin layer, as of 0.5 to 5 microns, of silicon dioxide, polyimide, or pyrex, overlaid with the nickel heating element. In this case, the heating element is supported by the silicon dioxide bridge structure. The central support at 37 also provides a mean for placing various bridge elements of the heating structure in parallel by running a conductive lead out over the intermediate support structure 37 to the heating element 36.

Referring now to FIG. 8, there is shown a folded cantilever flex structure 41 incorporating features of the present invention. The folded cantilever flex structures, useful for accelerometers, is fully disclosed and claimed in U.S. reissue Pat. No. 31,459 issued Dec. 6, 1983, the disclosure of which is hereby incorporated by reference in its entirety. The structure 41, shown in FIG. 8, is one quarter of a total accelerometer flex such quarter being bounded by a transverse center line 42 and a longitudinal center line 43.

The cantilever structure 41 is similar to that of FIG. 6 in that a mass 31 is supported from a frame structure 44 via the intermediary of a folded cantilever spring 13 and 13'. An etch stopped layer 12 on a (100) major face of a wafer is opened via opening 11 to the non-etch stopped semiconductor material which is to be etched. The opening 11 is patterned so as to define cantilever leaf spring portions 13 and 13' which are to be undercut. The free end of the first cantilever spring portion 13 is joined to a thin re-enforcing bar structure 45 of rectangular configuration with the sides of the narrow rectangle 45 being parallel to the traces of the {111} planes on the (100) face.

In the preferred embodiment, the bar structure 45 includes end portions 46 which extend well past the side edges 22 of the cantilevers 13 and 13' so as to allow for undercutting of the end regions 46 of the bar structure 45. Cantilever spring 13' is fixed at one end to the bar structure 45 and at the other end to the rectangular sensing mass structure 31, as previously described relative to FIGS. 5 and 6. The etch stopped layer 12, in the region of the cantilever spring 13 and 13', is slotted with slots 27 to divide each of the etch stopped spring structure 13 and 13' into four generally parallel cantilever spring elements such elements being joined together in pairs by means of slot interruption at 28. Cantilever spring structures 13 and 13' are dimensioned, arranged and slotted so that the springs 13 and 13' are completely undercut during the etch but the end re-enforcing bar 45 remains substantially non-undercut. Furthermore in a preferred embodiment, both major faces of the wafer include the identical etch stopped structures which are patterned in transverse registration through the wafer so that the wafer is etched simultaneously through opposite major faces to produce a folded cantilever structure as shown in FIG. 9.

Referring now to FIG. 10, the undercut etch process is shown in greater detail. More particularly, the side edges 22 and 23 of the cantilever 13' define diagonals of rectangles 47 and 48 bounded by {111} traces. The central elongated slot 49 defines the diagonal of a rectangular area bounded by {111} traces at 51. Rectangles 47, 48 and 51 have touching or overlapping adjoining side edges. When this condition is satisfied, the entire cantilever spring structure 13' will be undercut by the etch. In addition, the shorter slots 53 also define diagonals of rectangles 54 which further assist in expediting the rate at which the cantilever spring 13' is undercut during the etch.

Referring now to FIG. 11, there is shown an alternative cantilever spring 13' to that shown in FIG. 10. In this embodiment, the center slot 49 is interrupted at 47 so that the four parallel leg portions of the cantilever beam 13', as defined by the interrupted slots 27, are all interconnected at 28 and 57. The angle that the side edges 22 and 23 make with the most nearly parallel ones of the traces of the {111} planes on the (100) face has been increased so that the {111} trace rectangles 58 and 59, defined by the side edge diagonals 22 and 23, have touching or overlapping adjoining side edges at 61.

The other slots 27, centrally interrupted at 28, form diagonals of {111} trace rectangles 62 having touching or overlapping adjoining side edges at 63. Central slot 49, interrupted at 57, forms diagonals of {111} trace rectangles 64, 65 and 66. These slots 27 and 49 greatly reduce the etch time to undercut the cantilever 13' and further improve the uniformity of the thickness of the undercut cantilever 13'.

As thus far described, the undercut etch has been performed through a (100) major face of a wafer, this is not a requirement. The process is equally applicable to other major faces of diamond cubic material, such as the (110) face. More particularly, as in the previously described etches, the side edges of the structure, which is to be undercut etched, are disposed at an angle to the most nearly parallel traces of the {111} planes on the plane of the major face of the wafer.

Referring now to FIGS. 12 and 13, there is shown an example similar to that of FIG. 5 except that the major face of the wafer which is being etched is the (110) plane. In this case, the {111} planes intersect the (110) plane to produce {111} traces on the (110) plane forming the sides of rhomboids having a first pair of opposite parallel sides intersecting a second pair of opposite parallel sides at angles of 70.5 degrees and 109.5 degrees.

The side edges 22 and 23 of the cantilever or bridge structure, which is to be undercut by the etchant, are oriented at an angle to the most nearly parallel one of the {111} traces on the (110) major face of the wafer. The mass region 31, which is not to be undercut, has its side edges parallel to the {111} traces on the (110) face to form a rhomboid shape mass 31.

The same etching rules apply in this case as in the cases of FIGS. 2–11 with the exception that the side edges 22 and 23 and/or the edges of any slots through the etch stopped layer 12 define diagonals of rhomboids, rather than rectangles, defined by the {111} traces on the (110) face.

If these diagonal defined rhomboids have touching or overlapping adjacent side edges which are coextensive with the area to be undercut, bridge structures are formed bridging between non-undercut regions of the wafer or cantilever members are completely undercut without reliance on etching from external corners.

If the diagonal defined rhomboid areas are not coextensive with the entire area to be undercut, then to the extent the entire area is to undercut, undercutting of the non-coextensive area proceeds from the external corners of the non-coextensive etched stopped structure to be undercut.

In the case of FIGS. 12 and 13, the (111) planes are vertical relative to the (110) major face such that the resultant etched walls are vertical. This has some advantage in that narrower interconnecting and support structures such as 45 in FIGS. 8 and 9 and 37 in FIG. 7 may be fabricated when compared to etching through the (100) major face of the wafer.

As used herein, the term "etch stopped layer" means the etch rate for the underlying material which is to be etched is at least 10 times greater than the etch rate for the etch stopped layer, for the etchant being used.

The advantages of the present invention include: 1. reduced etch time for undercutting a cantilever of a given length and width; 2. improved uniformity in the thickness of the resultant undercut structure; 3. ability to form undercut bridge structures bridging between non-undercut structure, and; 4. ability to form undercut cantilevers supporting a mass at the free end of the undercut cantilever.

The method of undercut etching a wafer from both sides of the wafer is disclosed and claimed in our co-pending U.S. application Ser. No. 556,832 filed Dec. 1, 1983. The method for undercut etching of folded cantilevers is disclosed and claimed in our co-pending U.S. application Ser. No. 556,833 filed Dec. 1, 1983.

What is claimed is:

1. In a method for undercut anisotropic etching of an etch stopped layer portion on a (110) face of diamond cubic semiconductor material, to form beam or bridge structures, said etch stopped layer portion which is to be undercut having a pair of opposing side edges, the steps of:

orienting said pair of opposing side edges of the etch stopped layer portion which is to be undercut at an angle to the most nearly parallel one of the {111} traces on the (110) face being etched, so that said oriented side edges will be undercut from the sides; and contacting the (110) face being etched with an isotropic etchant for the semiconductive material so as to essentially completely undercut the etch stopped layer portion from both of said side edges in a direction toward the opposing side edge.

2. In a method for undercut anisotropic etching of an etch stopped layer portion on a (110) face of diamond cubic semiconductor material, to form beam or bridge structures, said etch stopped layer portion which is to be undercut having a pair of opposing side edges, the steps of:

orienting said pair of opposing side edges of the etch stopped layer portion which is to be undercut at an angle to the most nearly parallel one of the {111} traces on the (110) face being etched, so that said oriented side edges will be undercut from the sides;

slotting the etch stopped layer portion which is to be undercut with at least one elongated slot therethrough to the underlying material which is to be etched; and contacting the (110) face being etched with anisotropic etchant for the semiconductive material so as to essentially completely undercut the etch stopped layer portion from both of said side edges in a direction toward the opposing side edge.

3. In a method for undercut anisotropic etching of an etch stopped layer portion on a (110) face of diamond cubic semiconductor material to form beam or bridge structures, said etch stopped layer portion which is to be undercut having a pair of opposing side edges, the steps of:

orienting said pair of opposing side edges of the etch stopped layer portion which is to be undercut at an angle to the most nearly parallel one of the {111} traces on the (110) face being etched, so that said oriented edges will be undercut from the sides;

said etch stopped layer portion which being to be undercut is of generally quadrilateral shape such that when undercut it has a second pair of opposed side edges disposed generally parallel to the most nearly parallel ones of the {111} traces on the face being etched, whereby said undercut layer is joined along both of said second pair of side edges to lip portions of semiconductive material which is not to be undercut by said etchant for supporting said undercut portion of said etch stopped layer along said joined side edges; and contacting the (110) face being etched with anisotropic etchant for the semiconductive material so as to essentially completely undercut the etch stopped layer portion from both of said side edges in a direction toward the opposing side edge.

4. The method of claim 3 including the step of providing said etch stopped layer portion which is to be undercut on opposite major faces of a semiconductive wafer, and contacting both major faces with the etchant to undercut both of said etch stop layer portions on opposite sides of the wafer.

5. The product of the method of claim 1.
6. The product of the method of claim 3.
7. The product of the method of claim 4.

8. In a method for undercut anisotropic etching an etch stopped layer portion on a face of diamond cubic semiconductor material, to form beam or bridge structures, said etch stopped layer portion which is to be undercut having a pair of opposing side edges, the steps of:

orienting said pair of opposing side edges of the etch stopped layer portion which is to be undercut at an angle to the most nearly parallel one of the {111} traces on the face being etched, so that said oriented side edges will be undercut from the sides;

terminating said pair of opposing side edges which are to be undercut on a common {111} trace on the major face of the wafer such that the undercut etch stops on the common {111} trace on the major face of the wafer whereby said undercut layer portion is supported and terminated by a non-undercut lip portion of semiconductive material defined by a common {111} trace on the major face of the wafer; and contacting the face being etched with anisotropic etchant for the semiconductor material so as to undercut the etch stop layer portion from both of said side edges in the direction toward the opposing edge and to essentially completely undercut the etch stopped layer to form the beam or bridge structure terminated on a common {111} trace.

9. The method of claim 8 wherein said etch stopped layer portion which is to be undercut is of generally quadrilateral shape such that when undercut, it has a second pair of opposed side edges disposed generally parallel to the most nearly parallel ones of the {111} traces on the face being etched, whereby said undercut layer is joined along both of said second pair of side edges to lip portions of semiconductive material which is not to be undercut by said etchant for supporting said undercut portion of said etch stopped layer along said joined side edges.

10. The product of the method of claim 8.

11. In a method for undercut anisotropic etching of an etch stopped layer portion on a face of diamond cubic semiconductor material to form beam or bridge structures, said etch stopped layer portion which is to be undercut having a pair of opposing side edges, the steps of:

orienting said pair of opposing side edges of the etch stopped layer portion which is to be undercut at an angle to the most nearly parallel one of the {111} traces on the face being etched, so that said oriented side edges will be undercut from the side;

slotting the etch stopped layer portion which is to be undercut with an array of lines of elongated generally parallel interrupted side-by-side slots therethrough to the underlying material which is to be etched;

said side-by-side interrupted slots being elongated in a direction at a substantial angle to the {111} traces on the major face of the wafer and the lines of slots being axially offset with respect to each other such that the interrupted portions of one line of slots is located generally in transverse registration with the centers of the slots in the adjacent line of parallel slots, whereby undercut etch time is reduced in practice; and contacting the face being etched with anisotropic etchant for the semiconductive material so as to undercut the etch stopped layer portion from both of said side edges in a direction toward the opposing side edge and on the inside walls of the slots toward the adjacent slots to essentially completely undercut the etched stopped layer to form the beam or bridge structure.

12. The product of the method of claim 11.

* * * * *